United States Patent
Nagano

(10) Patent No.: US 11,417,917 B2
(45) Date of Patent: Aug. 16, 2022

(54) METHOD OF TESTING BATTERY, BATTERY TESTING APPARATUS, AND BATTERY

(71) Applicant: TOYOTA JIDOSHA KABUSHIKI KAISHA, Toyota (JP)

(72) Inventor: Shintaro Nagano, Okazaki (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 208 days.

(21) Appl. No.: 16/846,865

(22) Filed: Apr. 13, 2020

(65) Prior Publication Data
US 2020/0365952 A1 Nov. 19, 2020

(30) Foreign Application Priority Data
May 16, 2019 (JP) .............................. JP2019-092712

(51) Int. Cl.
| | | |
|---|---|---|
| H01M 10/48 | (2006.01) | |
| G01R 31/385 | (2019.01) | |
| G01R 31/3828 | (2019.01) | |
| G01R 31/389 | (2019.01) | |
| H01M 10/04 | (2006.01) | |
| H01M 4/13 | (2010.01) | |
| G01R 31/36 | (2020.01) | |
| H01M 4/02 | (2006.01) | |

(52) U.S. Cl.
CPC ........ *H01M 10/48* (2013.01); *G01R 31/3648* (2013.01); *G01R 31/386* (2019.01); *G01R 31/389* (2019.01); *G01R 31/3828* (2019.01); *H01M 4/13* (2013.01); *H01M 10/0422* (2013.01); *H01M 2004/027* (2013.01); *H01M 2004/028* (2013.01)

(58) Field of Classification Search
None
See application file for complete search history.

(56) References Cited

U.S. PATENT DOCUMENTS

| | | | |
|---|---|---|---|
| 2004/0095127 A1* | 5/2004 | Mohri | .............. G01R 31/382 324/117 R |
| 2013/0057288 A1 | 3/2013 | Ogata et al. | |
| 2015/0061602 A1* | 3/2015 | Lohmann | ............. G01R 33/093 324/426 |
| 2017/0016963 A1 | 1/2017 | Kimura et al. | |
| 2020/0091541 A1* | 3/2020 | Yoshitomi | ............... B60K 1/00 |
| 2020/0229782 A1 | 7/2020 | Imada et al. | |

FOREIGN PATENT DOCUMENTS

| | | |
|---|---|---|
| JP | 2013054984 A | 3/2013 |
| JP | 2013062028 A | 4/2013 |
| WO | 2015136931 A1 | 9/2015 |
| WO | 2019058993 A1 | 3/2019 |

* cited by examiner

Primary Examiner — Jas A Sanghera
(74) Attorney, Agent, or Firm — Dickinson Wright, PLLC

(57) ABSTRACT

A method of testing a battery includes the following steps. Step A1 is a step of preparing a test target battery. Step A2 is a step of measuring magnetism when applying an electric current to the test target battery. Step A3 is a step of obtaining a current distribution of the test target battery based on the magnetism measured in step A2. Step A4 is a step of comparing the current distribution of the test target battery obtained in step A3 with a normal current distribution that is obtained in advance, with predetermined reference positions being aligned with each other.

14 Claims, 5 Drawing Sheets

METHOD OF TESTING BATTERY, BATTERY TESTING APPARATUS, AND BATTERY

CROSS REFERENCE TO RELATED APPLICATIONS

The present application claims priority from Japanese Patent Application No. 2019-092712 filed on May 16, 2019, which is incorporated by reference herein in its entirety.

BACKGROUND

The present disclosure relates to a method of testing a battery, a battery testing apparatus, and a battery.

JP 2013-054984 A discloses the following magnetic measuring method. Prior to charge and discharge of a lithium secondary battery, magnetism of the opposite phase to that of the magnetism measured by each of magnetic sensors is generated by a canceling coil disposed around each of the magnetic sensors. Thereafter, the magnetic data recorded prior to the charge and discharge (i.e., magnetic data for correction) are subtracted from the magnetic data generated during the charge and discharge, to thereby reduce magnetic noise, so that the magnetic signal produced from the lithium-ion battery during the charge and discharge can be measured accurately.

SUMMARY

However, the method disclosed in JP 2013-054984 A is unable to accurately detect the current distribution in a single measurement. Moreover, in order to cancel the magnetic noise, the method requires the use of an additional canceling coil. The foregoing publication discloses that, for example, in order to cancel the magnetism measured by a magnetic sensor and bring the output from the magnetic sensor close to zero prior to charge and discharge of a lithium secondary battery, magnetism of the opposite phase to that of the magnetism measured by the magnetic sensor is generated by passing electric current through the canceling coil. As just described, the method involves a complicated and troublesome process, such as determining the current to be passed through the canceling coil, which is inevitable.

An embodiment of a method of testing a battery proposed herein includes the following steps A1 to A4.

Step A1 is a step of preparing a test target battery that is to be tested, the battery including an electrode assembly and an outer case enclosing the electrode assembly, the electrode assembly including a positive electrode active material layer, a negative electrode active material layer, and an insulating layer interposed between the positive electrode active material layer and the negative electrode active material layer.

Step A2 is a step of measuring magnetism when applying an electric current to the test target battery.

Step A3 is a step of obtaining a current distribution of the test target battery based on the magnetism measured in step A2.

Step A4 is a step of comparing the current distribution of the test target battery that is obtained in step A3 with a normal current distribution that is prepared in advance, with predetermined reference positions being aligned with each other.

The just-mentioned testing method eliminates the need for preparing the canceling coil, and moreover eliminates the need for the preparation step for controlling the canceling coil. As a result, it is easier to obtain the current distribution of the test target battery and compare the obtained current distribution with the normal current distribution.

The test target battery may include a magnetic material disposed at a predetermined position inside the outer case, for establishing a reference position. In this case, the magnetic material may be attached at a predetermined position on the electrode assembly. The magnetic material may be: at least one material selected from the group consisting of Ni, Co, Fe, Nd (neodymium), Mn, Sm (samarium), Y (yttrium), Zr, and Cr; an alloy containing the at least one material; or a composite material containing the at least one material, for example.

In the battery testing method, the electrode assembly may include a cut-out disposed at a predetermined position and having a predetermined shape.

The insulating layer may be a solid electrolyte layer.

An embodiment of a batten disclosed herein includes: an electrode assembly including a positive electrode active material layer, a negative electrode active material layer, and an insulating layer interposed between the positive electrode active material layer and the negative electrode active material layer; and an outer case enclosing the electrode assembly. A magnetic material is disposed at a predetermined position inside the outer case, the magnetic material being not involved in an electrochemical reaction of the battery.

The magnetic material may be attached at a predetermined position on the electrode assembly. The magnetic material may be: at least one material selected from the group consisting of Ni, Co, Fe, Nd (neodymium), Mn, Sm (samarium), Y (yttrium), Zr, and Cr; an alloy containing the at least one material; or a composite material containing the at least one material. In this case, the insulating layer may be a solid electrolyte layer.

Another embodiment of a battery disclosed herein includes: an electrode assembly including a positive electrode active material layer, a negative electrode active material layer, and an insulating layer interposed between the positive electrode active material layer and the negative electrode active material layer; and an outer case enclosing the electrode assembly. The electrode assembly may include a cut-out disposed at a predetermined position and having a predetermined shape. In this case, the insulating layer may be a solid electrolyte layer.

An embodiment of a battery testing apparatus disclosed herein includes: a first memory storage unit storing a current distribution of a test target battery that is to be tested, a second memory storage unit storing a normal current distribution related to the test target battery, and a processing unit configured to compare the current distribution of the test target battery with the normal current distribution to detect an abnormality in the test target battery.

Here, the current distribution stored in the first memory storage unit and the normal current distribution stored in the second memory storage unit may be configured to establish respective reference positions. The processing unit may be configured to compare the current distribution of the test target battery with the normal current distribution with the reference positions being aligned with each other.

DETAILED DESCRIPTION

The following description illustrates embodiments of a battery testing method and a battery according to the present disclosure. It should be noted, however, that the embodiments described herein are, of course, not intended to limit the present invention. The present invention is not limited to the embodiments described herein unless specifically stated otherwise.

Figure 1:
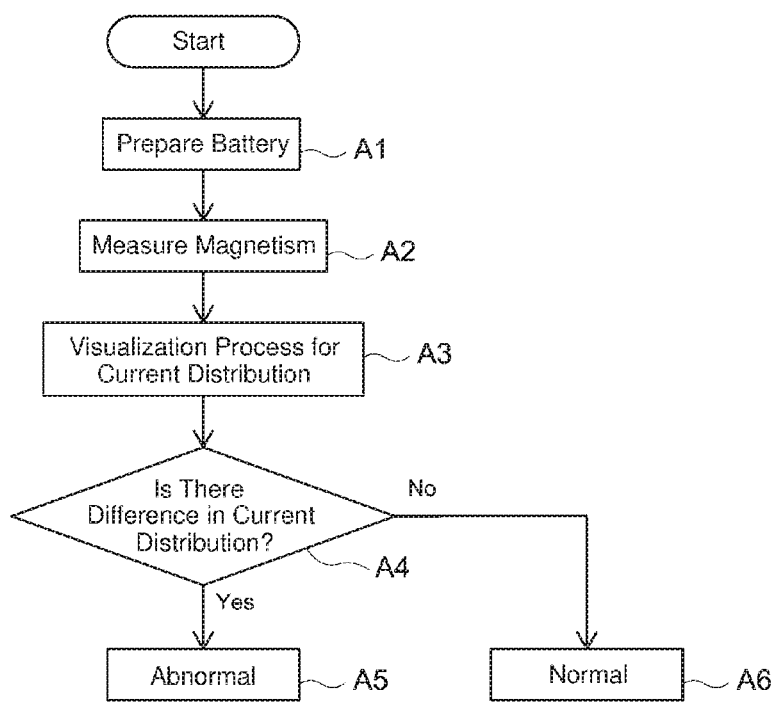
FIG. 1 is a flowchart illustrating an example of a method of testing a battery.

FIG. 1 is a flowchart illustrating an example of a method of testing a battery.

The method of testing a battery includes steps A1 to A4, as illustrated in FIG. 1.

Step A1 is a step of preparing a test target battery 100 (see FIG. 2) that is to be tested.

Step A2 is a step of measuring magnetism when applying an electric current to the test target battery 100.

Step A3 is a step of obtaining a current distribution of the test target battery 100 based on the magnetism measured in step A2.

Step A4 is a step of comparing the current distribution of the test target battery 100 that is obtained in step A3 with a normal current distribution that is prepared in advance, with predetermined reference positions being aligned with each other.

Hereinbelow, each of the steps A1 to A4 will be described.
Step A1

Figure 2:
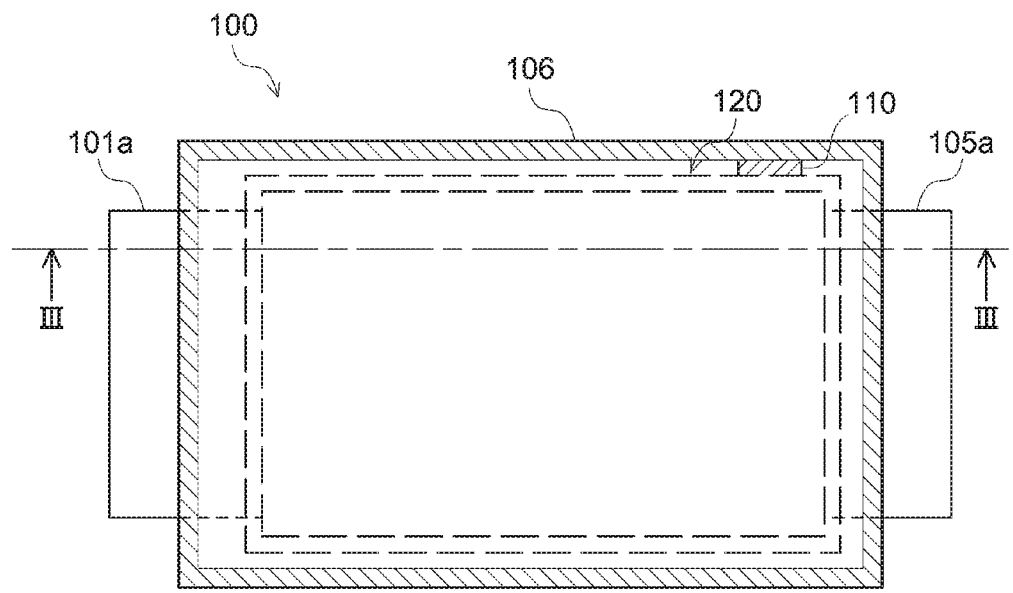
FIG. 2 is a plan view illustrating an example of a test target battery 100.
Figure 3:
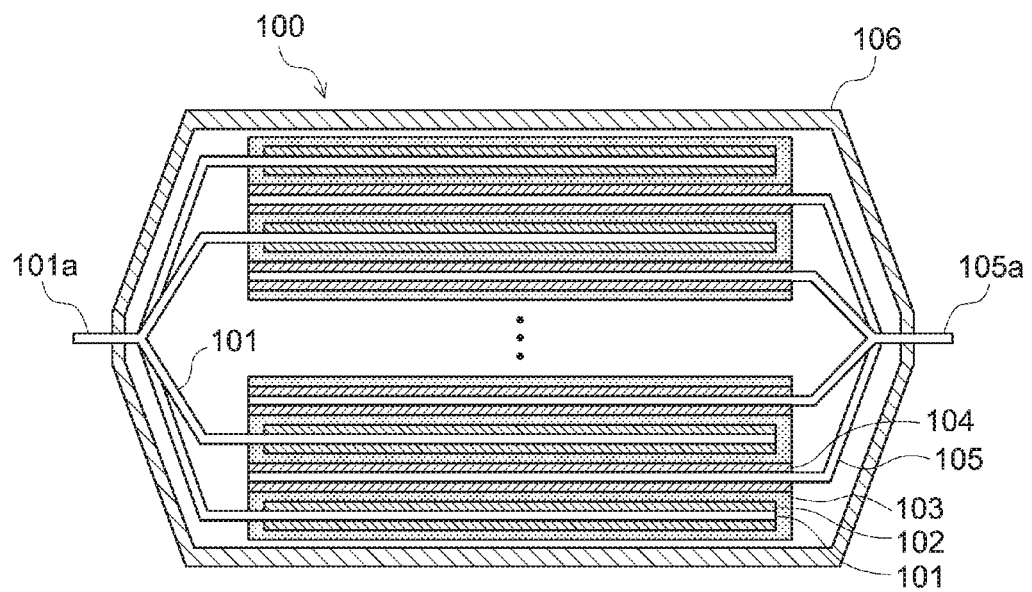
FIG. 3 is a cross-sectional view taken along line III-III of the test target battery 100.

Step A1 is a step of preparing a test target battery 100. FIG. 2 is a plan view illustrating an example of the test target battery 100. FIG. 3 is a cross-sectional view taken along line III-III of the test target battery 100. This embodiment illustrates, as an example, what is called a laminate-type lithium-ion secondary battery that is an all-solid-state battery, which uses a solid electrolyte as the electrolyte. The cross-section taken along line III-III is a cross section of the test target battery 100 that is taken along a positive electrode terminal 101a thereof.
Test Target Battery 100

As illustrated in FIGS. 2 and 3, the test target battery 100 illustrated as an example herein includes an electrode assembly 120 and an outer case 106. The electrode assembly 120 includes a positive electrode active material layer 102 and a negative electrode active material layer 104, which are overlapped with each other, and an insulating layer 103 interposed between the positive electrode active material layer 102 and the negative electrode active material layer 104. The battery case 106 encloses the electrode assembly 120. The insulating layer 103 may be a member that insulates the positive electrode active material layer 102 and the negative electrode active material layer 104 from each other. The insulating layer 103 may have electrical resistance. The insulating layer 103 may be such a layer that insulates electrons but does not insulate ions serving as charge carriers. In this embodiment, the insulating layer 103 is a solid electrolyte layer. Also in this embodiment, the test target battery 100 includes a magnetic material 110 that is disposed at a predetermined position inside the outer case 106, for establishing a reference position.
Electrode Assembly 120

The electrode assembly 120 includes a positive electrode current collector foil 101, a positive electrode active material layer 102, a solid electrolyte layer (insulating layer) 103, a negative electrode active material layer 104, and a negative electrode current collector foil 105.

For the positive electrode current collector foil 101, it is possible to use a metal foil made of a metal, such as stainless steel (SUS), Ni, Cr, Au, Pt, Al, Fe, Ti, and Zn. For the positive electrode current collector foil 101, it is possible to employ an appropriate metal foil taking its conductivity and oxidation resistance into consideration. In this embodiment, the positive electrode current collector foil 101 is an aluminum foil having a thickness of 10 μm. A portion of the positive electrode current collector foil 101 is provided with a tab lead 101a for electrical connection.

The positive electrode active material layer 102 is a layer containing a positive electrode active material, which is disposed on the positive electrode current collector foil 101. Preferably, the positive electrode active material layer 102 additionally contains a solid electrolyte, a binder, and a conductive agent. The positive electrode active material contained in the positive electrode active material layer 102 may be any known positive electrode active material, such as typified lithium-nickel-manganese-cobalt composite oxide.

A preferable example of the solid electrolyte contained in the positive electrode active material layer 102 may be a sulfide-based solid electrolyte, and a specific example is a mixture of $Li_2S$ and $P_2S_5$ (mixture mass ratio $Li_2S:P_2S_5$=50:50 to 100:0, more preferably $Li_2S:P_2S_5$=70:30). The sulfide-based solid electrolyte is not limited to the just-mentioned examples.

An example of the binder in the positive electrode active material layer 102 may be a fluorine atom-containing resin, such as represented by polyvinylidene difluoride (PVDF).

Examples of the conductive agent contained in the positive electrode active material layer 102 may include known conductive agents, such as carbon nanofibers (for example, VGCF available from Showa Denko Kabushiki Kaisha) and acetylene black. In the positive electrode active material layer 102, the conductive agent forms a conductive path between the positive electrode active material and the positive electrode current collector foil 101.

The thickness of the positive electrode active material layer 102 in the electrode assembly 120 is not limited to a particular thickness. The thickness of the positive electrode active material layer 102 may be, for example, less than or equal to 150 μm. In this embodiment, the thickness of the positive electrode active material layer 102 is set to 50 μm.

The solid electrolyte layer 103 is disposed on the positive electrode active material layer 102, and contains a lithium-ion conductor. The solid electrolyte layer 103 contains a solid electrolyte, and preferably further contains a binder. In addition, the solid electrolyte layer 103 provides insulation between the positive electrode active material layer 102 and the negative electrode active material layer 104. The solid electrolyte layer 103 contains no conductive agent. The solid electrolyte in the solid electrolyte layer may be any of the materials that have been mentioned above as the material that is usable for the positive electrode active material layer. A preferable example of the binder is butadiene rubber (BR).

The thickness of the solid electrolyte layer 103 in the electrode assembly 120 is not limited to a particular thickness. The thickness of the solid electrolyte layer 103 may be in the range of from 10 µm to 40 µm, for example. In this embodiment, the thickness of the solid electrolyte layer 103 is set to 20 µm.

The negative electrode active material layer 104 is a layer containing a negative electrode active material, which is disposed on the solid electrolyte layer 103. For the negative electrode active material layer, it is possible to use a known negative electrode material containing Si, such as represented by $Li_xSi$ (for example, $Li_{4.4}Si$). The use of the negative electrode material containing Si allows the battery to attain higher capacity.

However, the negative electrode active material in the negative electrode active material layer is not limited to the negative electrode active material containing Si. It is also possible to use other known negative electrode active materials as appropriate. The solid electrolyte and the binder in the negative electrode active material layer 104 may be any of the materials that have been mentioned above as the ones that are usable for the positive electrode active material layer as appropriate. Examples of the conductive agent in the negative electrode active material layer 104 may include known conductive agents, such as acetylene black. In the negative electrode active material layer 104, the conductive agent forms a conductive path between the negative electrode active material and the negative electrode current collector foil 105.

The thickness of the negative electrode active material layer 104 in the electrode assembly 120 is not limited to a particular thickness. The thickness of the negative electrode active material layer 104 may be in the range of from 8 µm to 20 µm, for example. In this embodiment, the thickness of the negative electrode active material layer 104 is set to 20 µm.

The negative electrode current collector foil 105 is disposed on the negative electrode active material layer 104. For the negative electrode current collector foil 105, it is possible to use a metal foil made of a metal such as SUS, Cu, Ni, Fe, Ti, Co, and Zn. In this embodiment, the negative electrode current collector foil 105 is a copper foil having a thickness of 20 µm. A portion of the negative electrode current collector foil 105 is provided with a tab lead for electrical connection.

Each of the positive electrode current collector foil 101 and the negative electrode current collector foil 105 is a metal foil in a rectangular shape. The positive electrode current collector foil 101 and the negative electrode current collector foil 105 oppose each other across the positive electrode active material layer 102, the solid electrolyte layer 103, and the negative electrode active material layer 104 that are interposed therebetween. A tab lead 101a, which is provided for the positive electrode current collector foil 101, extends from one end of the positive electrode current collector foil 101. A tab lead 105a, which is provided for the negative electrode current collector foil 105, is provided at one of the peripheral edges of the battery 100 that is opposite the peripheral edge at which the tab lead 101a of the positive electrode current collector foil 101 is provided. Alternatively, the tab lead 105a of the negative electrode current collector foil 105 may be provided at a different position from the tab lead 101a of the positive electrode current collector foil 101, on the same peripheral edge of the battery 100 at which the tab lead 101a of the positive electrode current collector foil 101 is provided.

The positive electrode current collector foil 101, the positive electrode active material layer 102, the solid electrolyte layer 103, the negative electrode active material layer 104, and the negative electrode current collector foil 105 are stacked one on another, as illustrated in FIG. 2, to thereby form a laminate, which forms the electrode assembly 120 of the all-solid-state battery 100. The laminate of the electrode assembly 120 of the all-solid-state battery 100 may include a plurality of positive electrode current collector foils 101, a plurality of positive electrode active material layers 102, a plurality of solid electrolyte layers 103, a plurality of negative electrode active material layers 104, and a plurality of negative electrode current collector foils 105 so that they are stacked one on another.

The solid electrolyte layer 103 and the negative electrode active material layer 104 are formed so as to be wider than the positive electrode active material layer 102, as illustrated in FIG. 2. The solid electrolyte layer 103 may be formed so as to have either the same width as, or a greater width than, the negative electrode active material layer 104. Each of the solid electrolyte layer 103 and the negative electrode active material layer 104 has a portion that overlaps with the positive electrode active material layer 102 and a portion that does not overlap the positive electrode active material layer 102, when viewed in the stacking direction. Because each of the solid electrolyte layer 103 and the negative electrode active material layer 104 protrudes from the positive electrode active material layer 102 when viewed in the stacking direction, lithium does not easily deposit on the negative electrode active material layer 104 that is positioned near the peripheral edges of the positive electrode active material layer 102, even when the reaction intensively occurs at the peripheral edges of the positive electrode active material layer 102.

Outer Case 106

The outer case 106 accommodates a stacked assembly that serves as the electrode assembly 120 of the all-solid-state battery. The outer case 106 employs what is called a laminate film. The tab leads 101a, 105a penetrate through the outer case 106 that is under the condition where hermeticity is ensured by a sealant film or the like, which is not shown in the drawings. The tab leads 101a, 105a extend outwardly from the respective peripheral edges of the outer case 106.

The laminate film used for the outer case 106 may be a resin laminated metal foil in which a resin film is provided on one or both sides of a metal foil. A typical example of the laminate film may be a resin laminated metal foil in which a resin film for providing mechanical strength is layered on one side of a metal foil and a heat-sealable resin film is layered on the other side thereof.

The metal foil in such a resin laminated metal foil may be a foil composed of, for example, aluminum or an aluminum alloy. The resin film for maintaining mechanical strength may be a film composed of, for example, polyester or nylon. The heat-sealable resin film may be a film composed of, for example, polyolefin. A specific example is a film made of, for example, polyethylene or polypropylene.

The laminate film used for the outer case 106 may be a sheet-shaped material in which a metal foil made of aluminum is used as the substrate material, and one side thereof is covered with nylon while the other side is covered with polypropylene, for example. In this case, the laminate film is made of a material in which aluminum is laminated with nylon and polypropylene. The outer case 106 composed of the laminate films is welded by heating and applying pressure to the laminate films under the condition where the laminate films are overlapped with each other. It should be noted that the metal foil is not limited to being made of aluminum, but may be other metal materials, such as stainless steel.

Magnetic Material 110

In the test target battery 100 of this embodiment, the magnetic material 110 for establishing a reference position is disposed at a predetermined position inside the outer case 106. The magnetic material 110 is attached at a predetermined position on the electrode assembly 120. In this embodiment, as illustrated in FIG. 2, the magnetic material 110 is attached to an edge of the electrode assembly 120 along one of the long sides of the electrode assembly 120, which is made up of a rectangular-shaped layered structure. The solid electrolyte layer 103 of the electrode assembly 120 is interposed between the magnetic material 110 and each one of the positive electrode current collector foil 101, the positive electrode active material layer 102, the negative electrode active material layer 104, and the negative electrode current collector foil 105 in the electrode assembly 120. The solid electrolyte layer 103 provides insulation between the magnetic material 110 and each one of the positive electrode current collector foil 101, the positive electrode active material layer 102, the negative electrode active material layer 104, and the negative electrode current collector foil 105 in the electrode assembly 120. Thus, because the magnetic material 110 is insulated from the positive electrode current collector foil 101, the positive electrode active material layer 102, the negative electrode active material layer 104, and the negative electrode current collector foil 105 of the electrode assembly 120 in this way, the magnetic material 110 is not involved in the electrochemical reaction of the battery 100.

It should be noted that the position at which the magnetic material 110 for establishing the reference position is not limited to an edge of the electrode assembly 120 along a longer side thereof. It is also possible that the magnetic material 110 may be disposed at an edge of the electrode assembly 120 along a shorter side thereof. When this is the case, it is possible that the width of the tab may be varied at the shorter side and the magnetic material 110 may be disposed at a position where it does not contribute to reaction. In this embodiment, each of the positive electrode current collector foil 101 and the negative electrode current collector foil 105 is a metal foil in a rectangular shape, and the electrode assembly 120 has a stacked structure in a rectangular shape. The electrode assembly 120 may not be in a rectangular shape, unless specifically stated otherwise. The magnetic material 110 may be in a circular shape or an elliptic shape for example. In this case, the magnetic material 110 may be disposed at an appropriate position on an edge of the electrode assembly 120 at which it does not contribute to the reaction.

The just-described embodiment has described an example in which the solid electrolyte layer 103 is interposed between the magnetic material 110 and the positive electrode current collector foil 101, the positive electrode active material layer 102, the negative electrode active material layer 104, and the negative electrode current collector foil 105. However, this is merely an illustrative example, unless specifically stated otherwise. For example, it is also possible that the positive electrode current collector foil 101 may extend at a location that is not coated with the positive electrode active material layer 102, and the magnetic material 110 may be attached to that location. In addition, it is also possible that the negative electrode current collector foil 105 may extend at a location that is not coated with the negative electrode active material layer 104, and the magnetic material 110 may be attached to that location. It is also possible that the magnetic material 110 may be attached only to the foil immediately before the battery is sealed. As just described, it is possible to dispose the magnetic material 110 at a location where no active material or no solid electrolyte exists.

Here, the magnetic material 110 for establishing the reference position may be preferably selected from a material that shows low magnetism and that is less likely to generate magnetic noise. From this viewpoint, the magnetic material 110 may be: at least one material selected from the group consisting of Ni, Co, Fe, Nd (neodymium), Mn, Sm (samarium), Y (yttrium), Zr, and Cr; an alloy containing one or a plurality of these materials; or a composite material containing one or a plurality of these materials. Preferable materials among them are Ni, Co, and Fe, from the viewpoints that these materials show low magnetism and are less likely to generate magnetic noise and that these materials are easily available.

In this embodiment, the magnetic material 110 has a predetermined shape, and is attached at a predetermined position on the electrode assembly 120, as described above. As long as the magnetic material 110 is attached at a predetermined position inside the outer case 106, the magnetic material 110 does not need to be attached to the electrode assembly 120. In addition, the magnetic material 110 may be disposed inside the outer case 106 so as not to be involved in the electrochemical reaction of the battery 100. Moreover, the magnetic material 110 may be disposed so as to determine a predetermined position of the electrode assembly 120. The shape of the magnetic material 110 may be in any arbitrary shape, such as a triangular shape, a rectangular shape, a circular shape, and an elliptic shape. In this embodiment, the magnetic material 110 is attached to the electrode assembly 120 by a binder. The binder may be any binder that is suitable for attaching the magnetic material 110, which may be selected among the binder agents contained in the positive electrode active material layer 102, the negative electrode active material layer 104, and the solid electrolyte layer 103 in the electrode assembly 120.

It should be noted that the test target battery is not limited to the above-described laminate-type lithium-ion secondary battery. For example, the test target battery may have any shape. The test target battery may also be, for example, a prismatic battery, in which the electrode assembly is enclosed in a prismatic case. The test target battery may also be a cylindrical battery, in which the electrode assembly is enclosed in a cylindrical case. Furthermore, although an all-solid-state battery is illustrated herein as an example of the test target battery, the test target battery is not limited to the all-solid-state battery. The test target battery may be, for example, what is called a liquid electrolyte battery, which uses an electrolyte solution as its electrolyte.

Step A2

Figure 4:
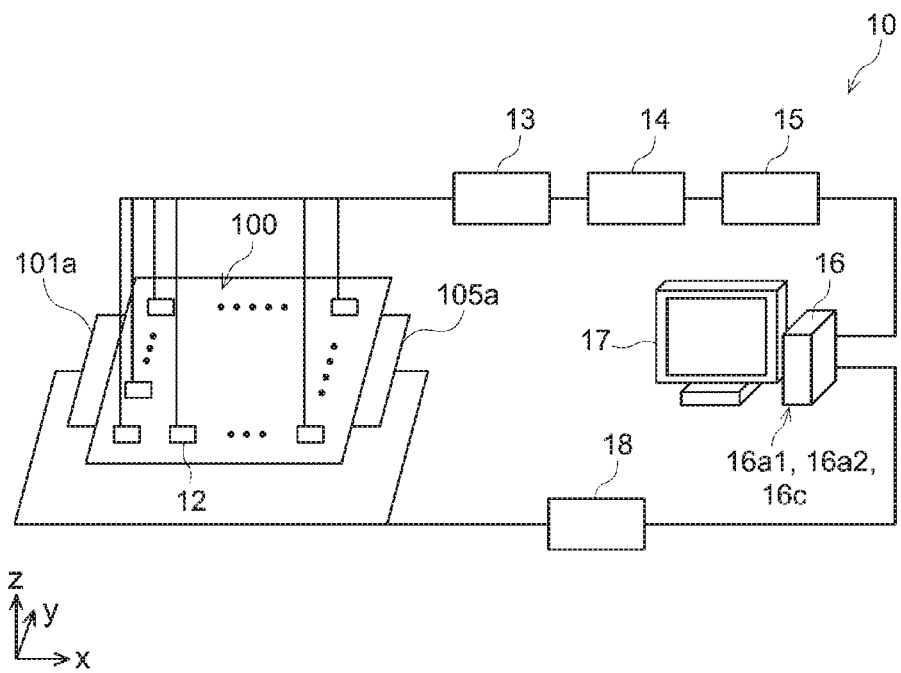
FIG. 4 is a schematic view illustrating the overall configuration of a battery magnetic measurement apparatus 10.

Step A2 is a step of measuring magnetism when applying an electric current to a test target battery. FIG. 4 is a schematic view illustrating the overall configuration of a battery magnetic measurement apparatus 10.

FIG. 4 shows that the test target battery 100 is arranged along a plane defined by the x-y axes. In this embodiment, as illustrated in FIGS. 2 and 3, the test target battery 1X) includes the electrode assembly 120, in which the positive electrode active material layer 102 and the negative electrode active material layer 104 are overlapped with each other with the insulating layer 103 interposed therebetween. The electrode assembly 120 is arranged so that the stacking direction in which the positive electrode active material layer 102 and the negative electrode active material layer 104 are stacked is oriented in a direction perpendicular (i.e., the z-direction) to the plane defined by the x-y axes The magnetic measurement apparatus 10 includes a plurality of magnetic sensors 12, a drive circuit 13, an amplifier filter unit 14, an A-D converter 15, a control computing device 16, a display device 17, and a feeder circuit 18.

Each of the plurality of magnetic sensors 12 measures a magnetic signal Bz that is perpendicular to the electrode surface of the battery 100 (i.e., along the z-axis). The drive circuit 13 drives each of the plurality of magnetic sensors 12. The amplifier filter unit 14 amplifies and filters the output from the drive circuit 13. The A-D converter 15 converts the output from the amplifier filter unit 14 to a digital signal. The control computing device 16 collects data of the output signals from the A-D converter 15, and analyzes the collected data (hereinafter also referred to as "magnetic data"). The control computing device 16 also controls various components of the battery magnetic measurement apparatus 10 The display device 17 displays results of the analysis that has been processed by the control computing device 16. The feeder circuit 18 applies a predetermined electric current to the test target battery 100.

Herein, the control computing device 16 may typically be a computer, which includes a memory storage device (such as memory) and a computer (such as a CPU). Each of various processes executed by the control computing device 16 may be implemented as a processing module that is executed by a predetermined program. Various functions of the control computing device 16 may be implemented appropriately by cooperative combinations of physical components and control operations based on the results of computation performed according to predetermined programs.

Each of the magnetic sensors 12 may be, for example, any magnetic sensor such as a hall effect sensor, a magnetic impedance sensor (MI sensor), a magnetic resistance sensor (MR sensor), and a flux gate. These magnetic sensors may suitably employ the structure and the operation of the magnetic measurement apparatus 10. This embodiment employs a MR sensor for each of the magnetic sensors 12.

Figure 5:
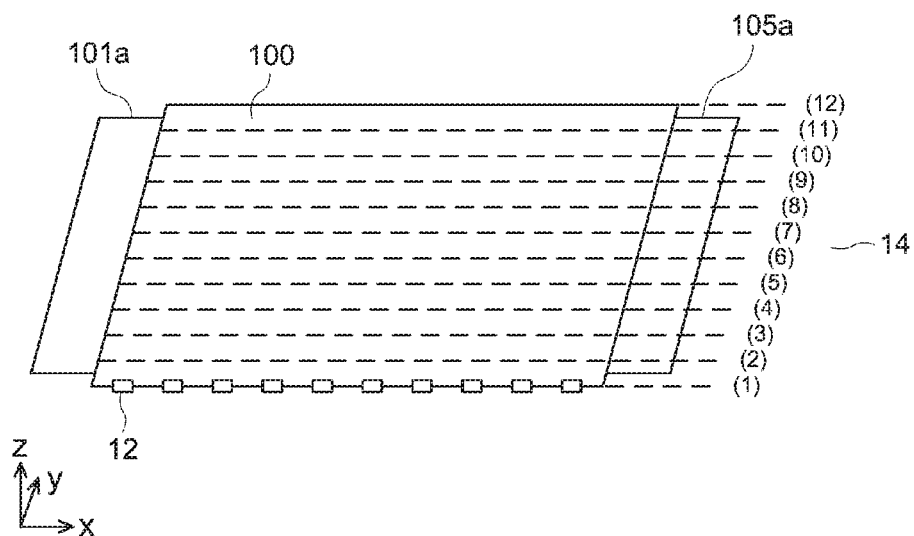
FIG. 5 is a schematic view for illustrating an example of the arrangement of magnetic sensors 12 for the test target battery 100.

FIG. 5 is a schematic view for illustrating an example of the arrangement of magnetic sensors 12 for the test target battery 100.

A plurality of magnetic sensors 12 are arranged side by side along the x-axis. In this embodiment, each of the magnetic sensor 12 is a MR sensor. Each of the magnetic sensors 12 faces toward the test target battery 100 so that it can measure a magnetic component Bz that is generated from the battery 100 and is perpendicular to the electrode surface. In this embodiment, 10 magnetic sensors 12 are arranged at regular intervals along the x-axis. Note that the number of the magnetic sensors 12 to be arranged side by side along the x-axis may be determined so as to substantially cover the electrode surface of the test target battery 100. Next, the plurality of magnetic sensors 12 are shifted in the y-axis direction to measure the magnetism over the entire plane of the battery 100. In this embodiment, 12 measurement lines indicated as (1) to (12) are provided respectively along the y-axis. When the measurement is completed for the measurement line (1), the measurement for the measurement line (2) is performed next, followed by the measurement for the measurement line (3), and likewise, the measurement is continued to the measurement line (12).

The plurality of magnetic sensors 12 may either be moved manually or be configured to be moved by a scanning mechanism that has been provided in advance along the test target battery 100.

In this embodiment, the gap distance between the magnetic sensors 12 is 2 cm. While shifting the magnetic sensors 12 in a y-axis direction 1 cm by 1 cm, the magnetic measurement is carried out along each of the 12 measurement lines indicated as (1) to (12). This means that magnetic measurement is performed at a total of 120 measurement positions for the test target battery 100.

In step A2, magnetism is measured when a current is applied to the test target battery 100. In this embodiment, in order to feed power to the battery 100, the positive electrode terminal 101a and the negative electrode terminal 105a of the battery 100 are connected to the feeder circuit 18. A predetermined magnitude of current is applied to the test target battery 100 by the feeder circuit 18. In this embodiment, for the testing, an alternating current voltage centering at 0 V is applied to the test target battery 100 by an alternating current power supply. When the alternating current voltage is applied, the current value may be set to, for example, about 0.5 Ap-p. Also, the magnetic signal generated when passing the alternating current may be measured by the magnetic sensors 12.

At each of the measurement lines indicated as (1) to (12), the magnetic signal from the test target battery 100 is recorded for 10 seconds at a sampling frequency of 1 kHz. The magnetic signal is stored into, for example, a hard disk (not shown) inside the control computing device 16. Herein, when recording the magnetic signal from the test target battery 100, the cut-off frequency of the high-pass filter is set at 0.1 Hz and the cut-off frequency of the low-pass filter is set at 30 Hz.

It should be noted that, in this embodiment, the magnetic measurement is performed while the plurality of magnetic sensors 12 arranged side by side along the x-axis are being moved in a y-axis direction, and the magnetic measurement is performed at a total of 120 measurement positions. However, the measurement positions at which the magnetic measurement is performed are not limited to the just-mentioned example. The measurement positions at which the magnetic measurement is performed may be set at appropriate positions such as to cover the entire electrode surface. Furthermore, the arrangement of the magnetic sensors 12, for example, is not limited to the just-mentioned example.

Although not shown in the drawings, it is possible to employ a modified example in which a plurality of arrays of magnetic sensors 12, each of the arrays containing a plurality of magnetic sensors 12 arranged side by side along the x-axis, may be arranged along the y-axis. This arrangement makes it possible to reduce the number of times of scanning (shifting) in the y-axis direction. It is also possible that the plurality of magnetic sensors 12 may be disposed at predetermined positions uniformly over the test region of the test target battery 100. When this is the case, the test region of the test target battery 100 may be set so as to cover the entire electrode surface. The magnetic sensors 12 may be arranged in a grid-like pattern along the x-axis and the y-axis, or may be arranged in a checkerboard-like pattern such as to stagger their positions every other line. When the plurality of magnetic sensors 12 are arranged uniformly over the test region of the test target battery 100 in this way, the process of measuring magnetism is carried out at one time. In other words, it is unnecessary to measure magnetism a plurality of times while shifting the magnetic sensors 12, so that the test time can be significantly reduced.

Step A3

Step A3 is a step of obtaining a current distribution of the test target battery 100 based on the magnetism measured in step A2.

In step A3, a predetermined current is applied to the test target battery 100 as described above to measure magnetism. Next, based on the measured magnetic signal, the magnitude and direction of the current is calculated to visualize the current distribution.

In the process of calculating the magnitude and orientation of the current and visualizing the current distribution, a current arrow chart technique is used for the method of obtaining a current distribution from the magnetic signals measured for the test target battery 100. In the current arrow chart, the magnetism along the x-axis and the magnetism along the y-axis are calculated analytically from the magnetism (Bz) along the z-axis. Then, the magnetism along the direction tangent to the calculated magnetism is projected as a pseudo current vector onto a measurement plane and displayed. In the current arrow chart technique, the same number of current vectors as the number of measurement points are reconfigured. The size of each current vector is represented by a contour line and the length of the arrow. The direction of each current vector is represented by the direction of the arrow.

In this embodiment, magnetic measurement is performed at a total of 120 measurement positions for the test target battery 100. The x component (Ix, i) and the y-component (Iy, i) of the current vector (Ii) at the i-th (i=1, 2, . . . , 120) position obtained from the current arrow chart technique are derived from the following equations using Bz, i.

$$Ix,i = dBz,i/dy \quad \text{Eq. (1)}$$

$$Iy,i = -dBz,i/dx \quad \text{Eq. (2)}$$

In addition, the magnitude (|Ii|) of the current vector is calculated from the following equation.

$$|Ii| = \sqrt{((Ix,i)^2 + (Iy,i))} \quad \text{Eq. (3)}$$

Here, the x component (Ix, i) and the y component (Iy, i) of the current vector (i) at the i-th position obtained from the current arrow chart technique when measuring the magnetism (Bx) along the x-axis and the magnetism along the y-axis (By) are derived from the following equations using Bx, i, and By, i.

$$Ix,i = By,I \quad \text{Eq. (4)}$$

$$Iy,i = -Bx,I \quad \text{Eq. (5)}$$

The magnitude (|Ii|) of the current vector is calculated in the same manner as the above equation (3).

According to the above-described processing procedure, the magnitude and direction of the current are calculated and the current distribution is visualized for the test target battery 100, based on the measured magnetic signal. In the vicinity of the location at which a short circuit has occurred, a great change in the magnetic field is observed, and the magnitudes and directions of the currents (current vectors) are obtained. The current distribution of the test target battery 100 may be obtained by measuring magnetism, calculating the magnitudes and directions of the current, and visualizing the current distribution, for both the obverse side and the reverse side of the test target battery 100 with respect to the direction in which the positive electrode active material layer 102 and the negative electrode active material layer 104 are stacked.

Here, the test target battery 100 is provided with a marking for establishing a reference position, as described above. The marking for establishing the reference position is a magnetic material 110 attached to the electrode assembly 120 of the test target battery 100 in this embodiment. In this case, a current is applied to the test target battery 100 as described above, and the current distribution of the test target battery 100 is obtained based on the magnetic signal measured from the test target battery 100. The magnetic signal measured from the test target battery 100 contains a magnetic signal originating from the magnetic material 110 that is attached as the marking. Then, the reference position is established based on the magnetic signal originating from the magnetic material 110 that is attached as the marking The current distribution of the test target battery 100 obtained in such a manner may configured to be able to establish a reference position. It should be noted that the purpose of attaching the magnetic material 110 is to establish the reference position for aligning the position of the electrode assembly 120 of the test target battery 100. From this viewpoint, the test target battery 100 may be provided with the magnetic material 110 that is attached to a predetermined appropriate position inside the outer case 106.

Step A4

Step A4 is a step of comparing the current distribution of the test target battery 100 that is obtained in step A3 with a normal current distribution that is prepared in advance, with predetermined reference positions being aligned with each other.

Normal Current Distribution

The normal current distribution refers to a current distribution of the test target battery 100 that is obtained when the test target battery 100 is in a normal condition, which may be configured to establish the reference position in the same manner as described above. The normal current distribution is, for example, obtained by preparing the same type of battery that is manufactured in the same manner as the test target battery 100 is manufactured. For the same type of battery prepared here as well, the magnetic material 110 for establishing the reference position may be disposed in the same manner as with the test target battery 100. For the same type of battery prepared here, the magnetic measurement is carried out in the above-described manner in the same measurement environment as the one in which the test target battery 100 is measured. Then, based on the magnetism measured in the magnetic measurement, the magnitudes and directions of the current are calculated, and the current distribution is visualized. At the time of the magnetic measurement, a temperature distribution is also measured to confirm that no abnormally heated spot is present. If any abnormally heated spot is present, a short circuit is suspected. Thereafter, the battery for which the current distribution has been obtained is disassembled, the presence or absence of a short circuit is inspected, and the battery that is observed to have a short circuit is removed. Then, the current distribution obtained for the battery in which no short circuit has been observed is employed as the normal current distribution.

The normal current distribution may be obtained by measuring magnetism, calculating the magnitudes and directions of the current, and visualizing the current distribution, for both the obverse side and the reverse side of the same type of battery as the test target battery 100 with respect to the direction in which the positive electrode active material layer 102 and the negative electrode active material layer 104 are stacked. Herein, the normal current distribution may be a current distribution obtained by calculating and visualizing average values of the magnitudes and directions of the current for a plurality of batteries that do not show a short circuit. The normal current distribution that is obtained in the just-described manner may be prepared in advance through a test or the like. The normal current distribution may be stored, for example, in the form of image data based on the magnitude of the current.

Herein, the normal current distribution is obtained by performing the magnetic measurement under the same environment as that in which the test target battery 100 is measured, and performing the process of calculating and visualizing the current distribution based on the measured magnetism, as described above. This means that both the normal current distribution and the current distribution measured for the test target battery 100 commonly contain magnetic noise that is specific to the measurement environment.

In step A4, the current distribution of the test target battery 100 obtained in step A3 is compared with a normal current distribution prepared in advance, with predetermined reference positions being aligned with each other. In this embodiment, the test target battery 100 is provided with the magnetic material 110 for establishing the reference position. Likewise, the same type of battery prepared for obtaining the normal current distribution is also provided with the magnetic material 110 for establishing the reference position. The reference positions are established based on these magnetic materials 110. Then, based on the reference positions, the current distribution of the test target battery 100 and the normal current distribution prepared in advance can be compared with each other, with the reference positions being aligned with each other. Both the current distribution of the test target battery 100 and the normal current distribution prepared in advance contain magnetic noise that is specific to the measurement environment. Therefore, in the comparison with the positions being aligned with each other, an abnormal spot in the current distribution of the test target battery 100 with respect to the normal current distribution can be obtained by, for example, obtaining a difference between the current distribution of the test target battery 100 and the normal current distribution.

Figure 6:
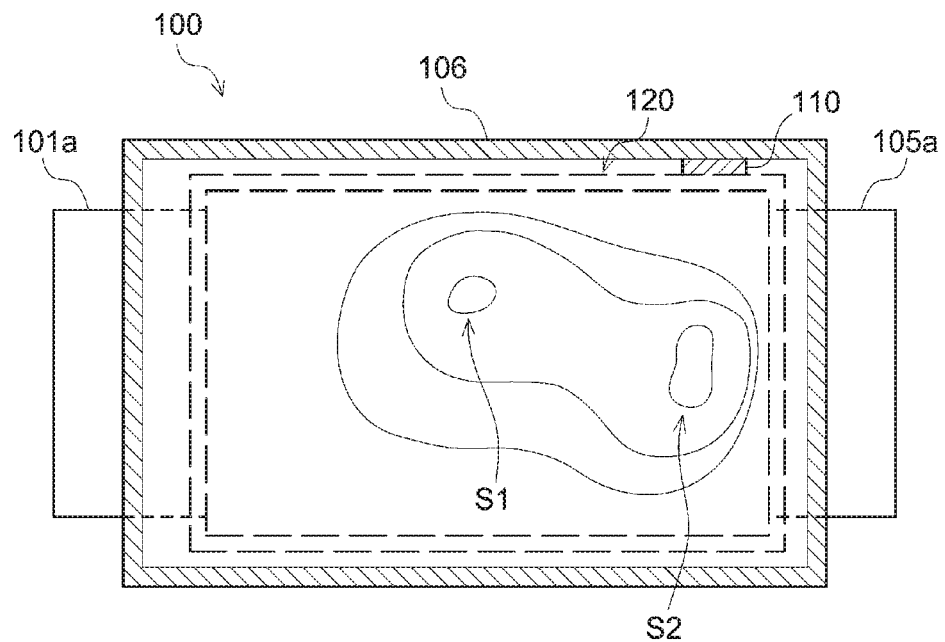
FIG. 6 is a schematic view that visualizes a normal current distribution prepared in advance.

Here, FIG. 6 is a schematic view that visualizes a normal current distribution that is prepared in advance. FIG. 6 shows the current distribution with contour lines based on the magnitudes of the current vectors obtained at the measurement points. The current vectors obtained at the measurement points are obtained based on the magnetism measured at the respective measurement points using the current arrow chart technique. As seen from FIG. 6, even the current distribution of a normal product contains portions S1 and S2 in which the current vectors are observed to be high. These are observed based on the magnetic noise specific to the measurement environment.

Figure 7:
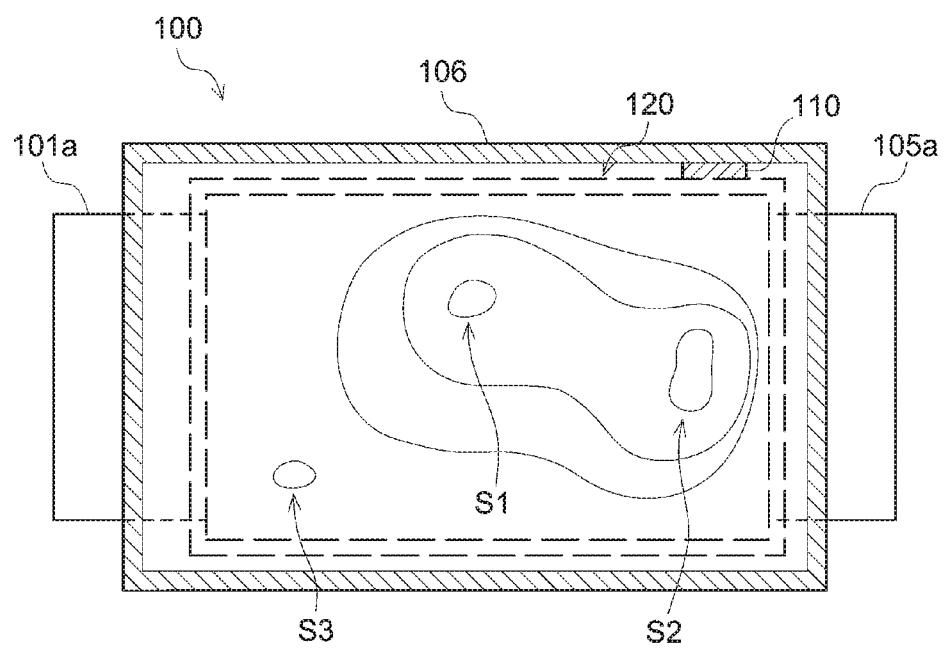
FIG. 7 illustrates an example of the test target battery 100 that is to be compared with the current distribution shown in FIG. 6.

FIG. 7 illustrates an example of the test target battery 100 that is to be compared with the current distribution shown in FIG. 6. For the current distribution shown in FIG. 6 and the current distribution shown in FIG. 7, the reference positions are established based on the positions of the magnetic materials 110, and based on the reference positions, these current distributions are aligned and compared with each other. The example shown FIG. 7 demonstrates that the test target battery 100 has portions S1 and S2 in which the current vectors are observed to be high, at similar locations in the normal current distribution shown in FIG. 6. Because these are also observed in the normal current distribution, it is believed that they originate from the magnetic noise that is specific to the measurement environment. In contrast, the example shown in FIG. 7 has a portion S3 in which the current vectors are observed to be high, at another location. This portion S3 is identified by comparing the normal current distribution shown in FIG. 6 with the current distribution of the test target battery 100 with the predetermined reference positions being aligned with each other. For example, the portion S3 may be identified by obtaining a difference between the normal current distribution and the current distribution of the test target battery 100 with the predetermined reference positions being aligned with each other. This makes it possible to more noticeably identify the portion S3 in which the current vectors are observed to be high.

Thus, an abnormal spot in the current distribution of the test target battery 100 is obtained by comparing the current distribution of the test target battery 100 with the normal current distribution that is prepared in advance, with the predetermined reference positions being aligned with each other.

In this case, as illustrated in FIG. 1, the test target battery 100 is prepared (A1). Magnetic measurement is performed for the test target battery 100 (A2). For the test target battery 100, the magnitudes and directions of the current are calculated, and the current distribution is visualized (A3). The current distribution of the test target battery 100 is compared with the normal current distribution that is prepared in advance, with the reference positions being aligned with each other, to determine whether or not there is a difference between the current distributions (A4). If a difference is observed between the current distributions, the test target battery 100 is determined to be abnormal (A5). If no difference is observed, the test target battery 100 is determined to be normal (A6). Because it is inevitable that measurement errors exist in obtaining the current distributions, the errors originating from the measurement errors may be obtained in advance. Then, in the process (A4) of determining whether or not there is a difference between the current distributions, the difference corresponding to the errors originating from the measurement errors may be treated as if there is no difference between the current distributions. This prevents an erroneous determination originating from the measurement errors in which abnormality is determined erroneously.

The method disclosed herein eliminates the need for preparing a canceling coil, and also eliminates the need for a preparation step for controlling the canceling coil. This makes it easier to obtain the current distribution of the test target battery 100 and compare the obtained current distribution with the normal current distribution, and makes it possible to detect abnormality in a single measurement.

It should be noted that, for the same type of battery as the test target battery 100, magnetism may be measured, the magnitude and direction of the current may be calculated, and the current distribution may be visualized on each of the obverse side and the reverse side of the battery. In step A4, when comparing the current distribution of the test target battery 100 with a normal current distribution prepared in advance, the respective current distributions obtained on the obverse side and the reverse side of the battery may be compared with their predetermined reference positions being aligned with each other. As a result, it is possible to more easily detect an abnormality that is present at a position close to the obverse side of the battery and an abnormality that is present at a position close to the reverse side of the battery. This makes it possible to detect an abnormality in the test target battery 100 more accurately.

Thus, as illustrated in FIGS. 2 and 3, the test target battery 100 includes the electrode assembly 120 including the positive electrode active material layer 102, the negative electrode active material layer 104, and an insulating layer (the solid electrolyte layer 103 in this embodiment) interposed therebetween, and the outer case 106 enclosing the electrode assembly 120. The battery 100 may include the magnetic material 110 that is disposed at a predetermined position inside the outer case 106 and that is not involved in an electrochemical reaction of the battery 100. The magnetic material 110 may be used as the reference to identify a predetermined reference position in the obtained current distribution. Then, the current distribution of the test target battery 100 is compared with the normal current distribution that is prepared in advance with the reference positions being aligned with each other, and it is determined whether or not there is a difference between the current distributions. With such a battery, it is easier to obtain the current distribution of the test target battery 100 and compare the obtained current distribution with the normal current distribution, and it is possible to conduct a test for detecting an abnormality in the battery more easily.

It should be noted that the process of comparing the current distribution of the test target battery 100 with the normal current distribution prepared in advance with the predetermined reference positions being aligned with each other may be implemented, for example, using a computer. When this is the case, the normal current distribution may be obtained by carrying out a predetermined test. The normal current distribution may be stored in the computer in the form of computer-usable data. The computer may be configured to operate according to a predetermined program and to compare the current distribution of the test target battery 100 obtained in step A3 with a normal current distribution, with the predetermined reference positions being aligned with each other.

The control computing device 16 may be, for example, a computer serving as a testing apparatus that embodies the above-described method. The control computing device 16 as the testing apparatus may include, for example, a first memory storage unit 16a1, a second memory storage unit 16a2, and a processing unit 16c. The first memory storage unit 16a1 may be configured to store a current distribution of the test target battery 100. The second memory storage unit 16a2 may be configured to store a normal current distribution related to the test target battery 100 and prepared in advance. The processing unit 16c may be configured to compare the current distribution of the test target battery 100 with the normal current distribution.

Here, the current distribution of the test target battery 100 that is stored in the first memory storage unit 16a1 and the normal current distribution that is stored in the second memory storage unit 16a2 may be configured to establish the reference positions, as described previously. The processing unit 16c may be configured to detect an abnormality in the test target battery 100 based on a result obtained by comparing the current distribution of the test target battery 100 with the normal current distribution with the reference positions being aligned with each other.

Next, in the foregoing embodiment, the magnetic material 110 for establishing the reference position is attached to the electrode assembly 120 of the test target battery 100, as illustrated in FIG. 2. However, the marking for establishing the reference position relative to the test target battery 100 is not limited to the provision of the magnetic material 110 as described above.

Figure 8:
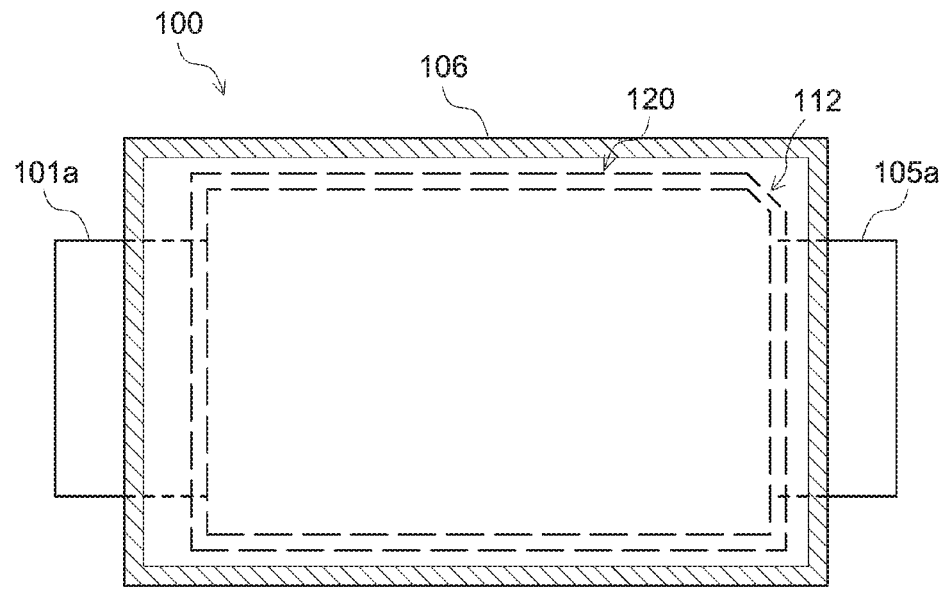
FIG. 8 is a plan view illustrating another example of the test target battery 100.

FIG. 8 is a plan view illustrating another example of the test target battery 100. As illustrated in FIG. 8, the electrode assembly 120 of the test target battery 100 may include a cut-out 112 disposed at a predetermined position and having a predetermined shape. In the embodiment shown in FIG. 8, the electrode assembly 120 of the test target battery 100 has a cut-out in a portion in which the active material layers are stacked. The position in the electrode assembly 120 of the battery 100 at which the cut-out is formed is not limited to the example shown in FIG. 8.

Figure 9:
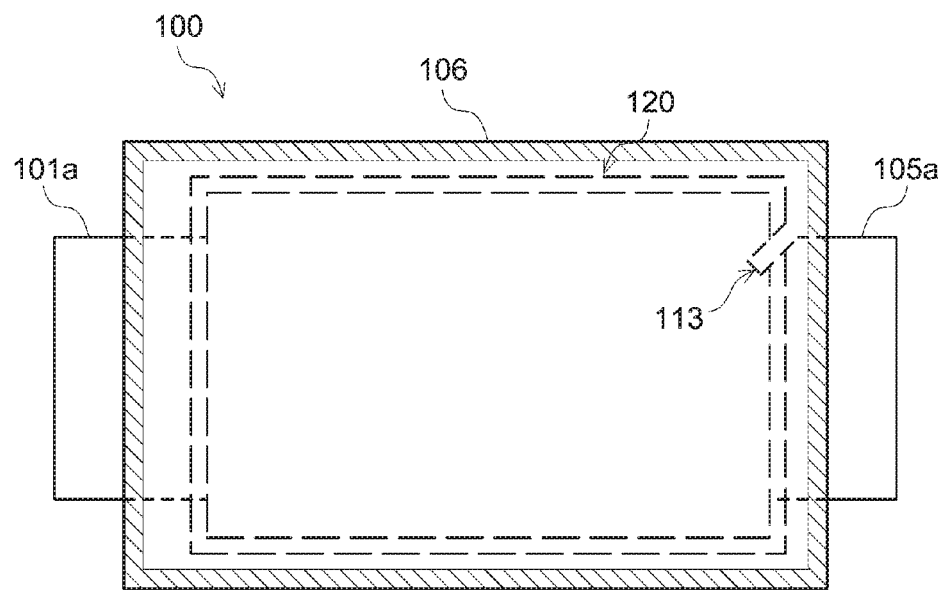
FIG. 9 is a plan view illustrating yet another example of the test target battery 100.

FIG. 9 is a plan view illustrating yet another example of the test target battery 100. For example, as illustrated in FIG. 9, a cut-out 113 may be formed such that a portion of the positive electrode active material layer 102 or the negative electrode active material layer 104 is cut out in the vicinity of the uncoated portion in which the active material layer is not formed on the positive electrode current collector foil 101 or the negative electrode current collector foil 105. In this case, it is also possible that the cut-out may be formed in a portion of the uncoated portion in which the active material layer is not formed on the positive electrode current collector foil 101 or the negative electrode current collector foil 105.

Thus, a cut-out may be formed in a portion of the electrode assembly 120. In this case, the electrode assembly 120 may have a cut-out having a predetermined shape and a predetermined size. These cut-outs 112 and 113 affect the magnitude and direction of the current that are obtained based on the measured magnetism, and they appear in the current distribution. Accordingly, these cut-outs 112 and 113 are able to establish a predetermined reference position for the test target battery 100.

The normal current distribution for such a test target battery 1x) is obtained based on the same type of battery as the one provided with the same cut-out. Here, for the same type of battery as the one provided with the same cut-out, magnetism is measured in the same measurement environment as the one in which the test target battery 100 is measured. Then, based on the measured magnetism, the magnitude and direction of the current may be calculated, and the current distribution may be visualized, so that the normal current distribution can be obtained. Then, the current distribution of the test target battery 100 is compared with the normal current distribution that is prepared in advance, with the reference positions being aligned with each other, and it is determined whether or not there is a difference between the current distributions (A4). This eliminates the need for the use of a canceling coil. As a result, such a battery makes is easier to obtain the current distribution thereof and compare the obtained current distribution with a normal current distribution, so that the test for detecting abnormality in the battery can be performed more easily.

Note that the electrode assembly 120 including the cut-out 112 or 113, shown in FIG. 8 or 9, is obtained by stacking a positive electrode sheet and a negative electrode sheet on one another. In this case, the positive electrode sheet is prepared so that the positive electrode active material layer 102 is formed on the positive electrode current collector foil 101 and a cut-out in a predetermined shape and size is formed at a predetermined position. Likewise, the negative electrode sheet is prepared so that the negative electrode active material layer 104 is formed on the negative electrode current collector foil 105 and a cut-out in a predetermined shape and size is formed at a predetermined position. The positive electrode sheet and the negative electrode sheet are stacked one on another with the cut-outs being aligned with each other, to obtain the electrode assembly 120.

The shape, size, and position of the cut-out formed in the electrode assembly 120 are not limited to the embodiments shown in FIGS. 8 and 9. The shape, size, and position of the cut-out formed in the electrode assembly 120 may be determined appropriately so that the function of establishing the reference position with respect to the test target battery 100 can be served.

Various embodiments of the battery testing method, the battery testing apparatus, and the battery have been described hereinabove according the present disclosure. Unless specifically stated otherwise, the embodiments of battery testing method, the battery testing apparatus, and the battery that are described herein do not limit the scope of the present invention.

What is claimed is:

1. A method of testing a battery, comprising:
    a step A1 of preparing a test target battery that is to be tested, the battery including an electrode assembly and an outer case enclosing the electrode assembly, the electrode assembly including a positive electrode active material layer, a negative electrode active material layer, and an insulating layer interposed between the positive electrode active material layer and the negative electrode active material layer;
    a step A2 of measuring magnetism when applying an electric current to the test target battery;
    a step A3 of obtaining a current distribution of the test target battery based on the magnetism measured in the step A2; and
    a step A4 of comparing the current distribution of the test target battery that is obtained in the step A3 with a normal current distribution that is prepared in advance, with predetermined reference positions being aligned with each other;
    wherein the test target battery includes a magnetic material disposed at a predetermined position inside the outer case, for establishing the reference position.

2. The method according to claim 1, wherein the magnetic material is attached at a predetermined position on the electrode assembly.

3. The method according to claim 1, wherein the magnetic material is: at least one material selected from the group consisting of Ni, Co, Fe, Nd, Mn, Sm, Y, Zr, and Cr; an alloy containing the at least one material; or a composite material containing the at least one material.

4. The method according to claim 1, wherein the insulating layer is a solid electrolyte layer.

5. A method of testing a battery, comprising:
    a step A1 of preparing a test target battery that is to be tested, the battery including an electrode assembly and an outer case enclosing the electrode assembly, the electrode assembly including a positive electrode current collector foil on which a positive electrode active material layer is formed, a negative electrode current collector foil on which a negative electrode active material layer is formed, and an insulating layer interposed between the positive electrode active material layer and the negative electrode active material layer;
    a step A2 of measuring magnetism of an area including the positive electrode current collector foil and the negative electrode current collector foil when applying an electric current to the test target battery;
    a step A3 of obtaining a current distribution of the test target battery based on the magnetism measured in the step A2; and
    a step A4 of comparing the current distribution of the test target battery that is obtained in the step A3 with a normal current distribution that is prepared in advance, with predetermined reference positions being aligned with each other;
    wherein at least one of the positive electrode current collector foil and the negative electrode current collector foil includes a cut-out disposed at a predetermined position and having a predetermined shape.

6. The method according to claim 5, wherein the insulating layer is a solid electrolyte layer.

7. A battery comprising:
    an electrode assembly including a positive electrode active material layer, a negative electrode active material layer, and an insulating layer interposed between the positive electrode active material layer and the negative electrode active material layer;
    an outer case accommodating the electrode assembly; and
    a magnetic material disposed at a predetermined position inside the outer case, the magnetic material being not involved in an electrochemical reaction of the battery.

8. The battery according to claim 7, wherein the magnetic material is attached at a predetermined position on the electrode assembly.

9. The battery according to claim 7, wherein the magnetic material is: at least one material selected from the group consisting of Ni, Co, Fe, Nd, Mn, Sm, Y, Zr, and Cr; an alloy containing the at least one material; or a composite material containing the at least one material.

10. The battery according to claim 7, wherein the insulating layer is a solid electrolyte layer.

11. A battery comprising:
    an electrode assembly including a positive electrode current collector foil on which a positive electrode active material layer is formed, a negative electrode current collector foil on which a negative electrode active material layer is formed, and an insulating layer interposed between the positive electrode active material layer and the negative electrode active material layer; and
    an outer case enclosing the electrode assembly,
    wherein at least one of the positive electrode current collector foil and the negative electrode current collector foil includes a cut-out disposed at a predetermined position and having a predetermined shape.

12. The battery according to claim 11, wherein the insulating layer is a solid electrolyte layer.

13. A battery testing apparatus comprising:
    a first memory storage unit storing a current distribution of a test target battery that is to be tested;
    a second memory storage unit storing a normal current distribution related to the test target battery; and
    a processing unit, wherein:
    the current distribution of the test target battery stored in the first memory storage unit and the normal current distribution stored in the second memory storage unit are configured to establish respective reference positions; and
    the processing unit is configured to detect an abnormality in the test target battery based on a result obtained by comparing the current distribution of the test target battery with the normal current distribution of the test target battery with the reference positions being aligned with each other;

wherein the test target battery includes an outer case and a magnetic material disposed at a predetermined position inside the outer case, for establishing the reference position.

14. A battery testing apparatus comprising:
a first memory storage unit storing a current distribution of a test target battery that is to be tested;
a second memory storage unit storing a normal current distribution related to the test target battery; and
a processing unit, wherein:
the current distribution of the test target battery stored in the first memory storage unit and the normal current distribution stored in the second memory storage unit are configured to establish respective reference positions; and
the processing unit is configured to detect an abnormality in the test target battery based on a result obtained by comparing the current distribution of the test target battery with the normal current distribution of the test target battery with the reference positions being aligned with each other;
wherein the test target battery includes a positive electrode current collector foil on which a positive electrode active material layer is formed, a negative electrode current collector foil on which a negative electrode active material layer is formed, and an insulating layer interposed between the positive electrode active material layer and the negative electrode active material layer;
and wherein at least one of the positive electrode current collector foil and the negative electrode current collector foil includes a cut-out disposed at a predetermined position and having a predetermined shape for establishing the reference position.

* * * * *